US008319335B2

(12) United States Patent
Bayerer et al.

(10) Patent No.: US 8,319,335 B2
(45) Date of Patent: Nov. 27, 2012

(54) POWER SEMICONDUCTOR MODULE, POWER SEMICONDUCTOR MODULE ASSEMBLY AND METHOD FOR FABRICATING A POWER SEMICONDUCTOR MODULE ASSEMBLY

(75) Inventors: Reinhold Bayerer, Warstein (DE); Olaf Hohlfeld, Warstein (DE); Thilo Stolze, Arnsberg (DE)

(73) Assignee: Infineon Technologies AG, Neubiberg (DE)

( * ) Notice: Subject to any disclaimer, the term of this patent is extended or adjusted under 35 U.S.C. 154(b) by 275 days.

(21) Appl. No.: 12/752,825

(22) Filed: Apr. 1, 2010

(65) Prior Publication Data

US 2010/0252922 A1 Oct. 7, 2010

(51) Int. Cl.
*H01L 23/34* (2006.01)

(52) U.S. Cl. ................. 257/717; 257/565; 257/E23.078

(58) Field of Classification Search ........... 257/E23.078, 257/565, 717

See application file for complete search history.

(56) References Cited

U.S. PATENT DOCUMENTS

| | | | | |
|---|---|---|---|---|
| 4,607,276 | A | 8/1986 | Butt | |
| 4,636,580 | A | 1/1987 | Neidig et al. | |
| 5,296,739 | A * | 3/1994 | Heilbronner et al. | 257/687 |
| 5,297,001 | A * | 3/1994 | Sterling | 361/717 |
| 5,459,356 | A | 10/1995 | Schulze et al. | |
| 6,087,682 | A | 7/2000 | Ando | |
| 6,097,682 | A | 8/2000 | Narumi et al. | |
| 7,034,395 | B2 | 4/2006 | Stolze | |
| 2004/0164388 | A1 | 8/2004 | Stolze | |
| 2004/0217465 | A1* | 11/2004 | Stolze | 257/706 |
| 2009/0161472 | A1 | 6/2009 | Wang et al. | |

FOREIGN PATENT DOCUMENTS

| | | | |
|---|---|---|---|
| DE | 3307704 | A1 | 9/1984 |
| DE | 3505086 | A1 | 8/1986 |
| DE | 3508456 | A1 | 9/1986 |
| DE | 3643288 | A1 | 6/1988 |
| DE | 4001554 | A1 | 7/1991 |
| DE | 4111247 | A1 | 10/1992 |
| DE | 4122428 | A1 | 1/1993 |
| DE | 19529237 | C1 | 8/1996 |
| DE | 19707514 | A1 | 8/1998 |
| DE | 19942915 | A1 | 3/2001 |
| DE | 10114297 | A1 | 10/2002 |
| DE | 10142971 | A1 | 3/2003 |
| DE | 10149886 | A1 | 4/2003 |
| DE | 10340297 | A1 | 3/2005 |
| DE | 10343502 | A1 | 5/2005 |
| DE | 102004051039 | B4 | 6/2008 |
| EP | 0584668 | A1 | 8/1993 |

OTHER PUBLICATIONS

Bayerer et al., "Leistungshalbleitermodule in Direkt-Bonding-Technik," Technische Rundschau, Aug. 1988, pp. 38-45, No. 32.

* cited by examiner

*Primary Examiner* — Ha Tran T Nguyen
*Assistant Examiner* — Aaron Dehne
(74) *Attorney, Agent, or Firm* — Murphy, Bilak & Homiller, PLLC

(57) ABSTRACT

The invention relates to a power semiconductor module including a power semiconductor chip arranged on a substrate and comprising a bottom side facing the substrate, a top side facing away from the substrate, and an electrical contact face arranged on the top side. A bond wire is bonded to the contact face. At least when the power semiconductor module is fastened to a heatsink, a contact pressure element creates a contact pressure force (F) acting on a sub-portion 36 of a bond wire portion configured between two adjacent bond sites. The contact pressure force (F) results in the power semiconductor chip and a substrate beneath being pressed against the heatsink.

25 Claims, 10 Drawing Sheets

52 51 5 100 53 81 31 4 41 32 3 312 21 1 20 22 201 200a 200 21 20 22 2

POWER SEMICONDUCTOR MODULE, POWER SEMICONDUCTOR MODULE ASSEMBLY AND METHOD FOR FABRICATING A POWER SEMICONDUCTOR MODULE ASSEMBLY

PRIORITY CLAIM

This application claims priority to German Patent Application No. 10 2009 002 191.4-33 filed on 3 Apr. 2009, the content of which is incorporated herein by reference in its entirety.

FIELD OF TECHNOLOGY

The invention relates to a power semiconductor module.

BACKGROUND

Power semiconductor modules comprise, as a rule, at least one power semiconductor chip sited on a substrate and which because of the heat dissipated in its operation needs to be cooled. For this purpose, the substrate is press-bonded to a heatsink. Disposed between the substrate and the heatsink is a thermal compound, e.g., a thermal paste for optimum thermal conductance to the heatsink. To avoid air inclusions the thermal compound evens out irregularities in the substrate and heatsink if there is a sufficient amount of the thermal compound. On the other hand, the thermal conductance—assuming there is no problem with air inclusions—is all the more effective the thinner the coating of the thermal compound.

Shown in FIG. 1 is a cross-section through a portion of a conventional power semiconductor module 100 pressed against a heatsink 200. The power semiconductor module 100 comprises a substrate 2 with a ceramic core 20 topped and bottomed by a top-side metallization 21 and bottom-side metallization 22 respectively. A power semiconductor chip 1 is soldered by means of a solder layer 15 to the top-side metallization 21. The contact pressure force F for pressing the substrate 2 against the heatsink 200 is achieved by a stamp 25 pressing on the substrate 2 alongside the power semiconductor chip 1.

In such an assembly the substrate 2 is deformed by the contact pressure force F so that the smallest spacing between the substrate 2 and the heatsink 200 does not materialize in the portion beneath the power semiconductor chip 1 but alongside the latter. The drawback in this arrangement is that the thermal conductance between the substrate 2 and heatsink 200 is an optimum not ideally beneath the power semiconductor chip 1 but alongside the latter.

Although it is basically possible to apply the pressure top-down on the semiconductor chip, as could be achieved with a stamp, for example, such a stamp, to properly distribute the force would have to have a certain minimum cross-sectional area on the chip to prevent the latter from being damaged. But, because of the high currents needed to flow through the power semiconductor chip 1 as a rule, it is advantageous that the chip 1 is connected with as low an impedance as possible. This is achievable by circuiting a plurality of leads in parallel, for example in the form of bond wires, each bonded to a metallization topping the chip practically completely. However, an expansive stamp has a large footprint on the metallization topping the chip making it no longer available for fabricating the bonds.

Although a contact of adequate low impedance is also achievable with one or a few thick bond wires, the redundancy is then lacking should a bond malfunction, for instance. When one or more leads malfunction the operating temperature rises in the remaining functioning bond wires which, in turn is detrimental to managing the temperature of the module.

SUMMARY

An advantage of an embodiment of the present invention is thus to provide a power semiconductor module featuring a substrate topped by a power semiconductor chip which now achieves a good thermal conductance to the heatsink beneath the power semiconductor chip without necessitating a stamp taking up valuable space on the top of the chip needed for its electrical contact.

A further advantage of an embodiment of the invention is to provide a power semiconductor module assembly with a power semiconductor module coupled to a heatsink beneath the power semiconductor chip by a low thermal contact resistance, again, without necessitating a stamp taking up valuable space on the top of the chip needed for its electrical contact.

Yet another advantage of an embodiment of the invention is to provide a method for fabricating such a power semiconductor module assembly.

The power semiconductor module as now detailed is devised for mounting on a heatsink, it featuring a substrate topped by a power semiconductor chip the bottom of which faces the substrate and the top of which is on the side facing away from the substrate. In addition, the power semiconductor chip is topped by a first electrical contact face.

Provided furthermore is a bond wire bonded by a first bond site and a second bond site to the first electrical contact face and comprising between the first bond site and the second bond site a first bond wire portion made up by the whole portion of the bond wire between the first bond site and the second bond site, the bond wire being spaced away from the first electrical contact face in this portion.

The module comprises furthermore a contact pressure element devised to exert a contact pressure force to a first electrical contact face in mounting the power semiconductor module on the heatsink, this force resulting in the power semiconductor chip and the substrate being pressed against the heatsink. In this arrangement, the contact pressure force is created in that the contact pressure element is urged against just a sub-portion and not against the whole of the first bond wire portion.

Bonding such a power semiconductor module to a heatsink mounted on the side of the substrate facing away from the power semiconductor chip results in a power semiconductor module assembly in which the contact pressure element exerts a contact pressure force on the first electrical contact face pressing the power semiconductor chip and the substrate against the heatsink. Here again, the contact pressure force is created in that the contact pressure element is urged against just a sub-portion and not against the whole of the first bond wire portion.

To fabricate such a power semiconductor module assembly a power semiconductor module as described above and a heatsink are provided, which are then bonded together to produce a contact pressure force acting on the first electrical contact face by which the contact pressure element is urged against just a sub-portion and not against the whole of the first bond wire portion, the contact pressure force pressing the power semiconductor chip and the substrate against the heatsink.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Figure 1:
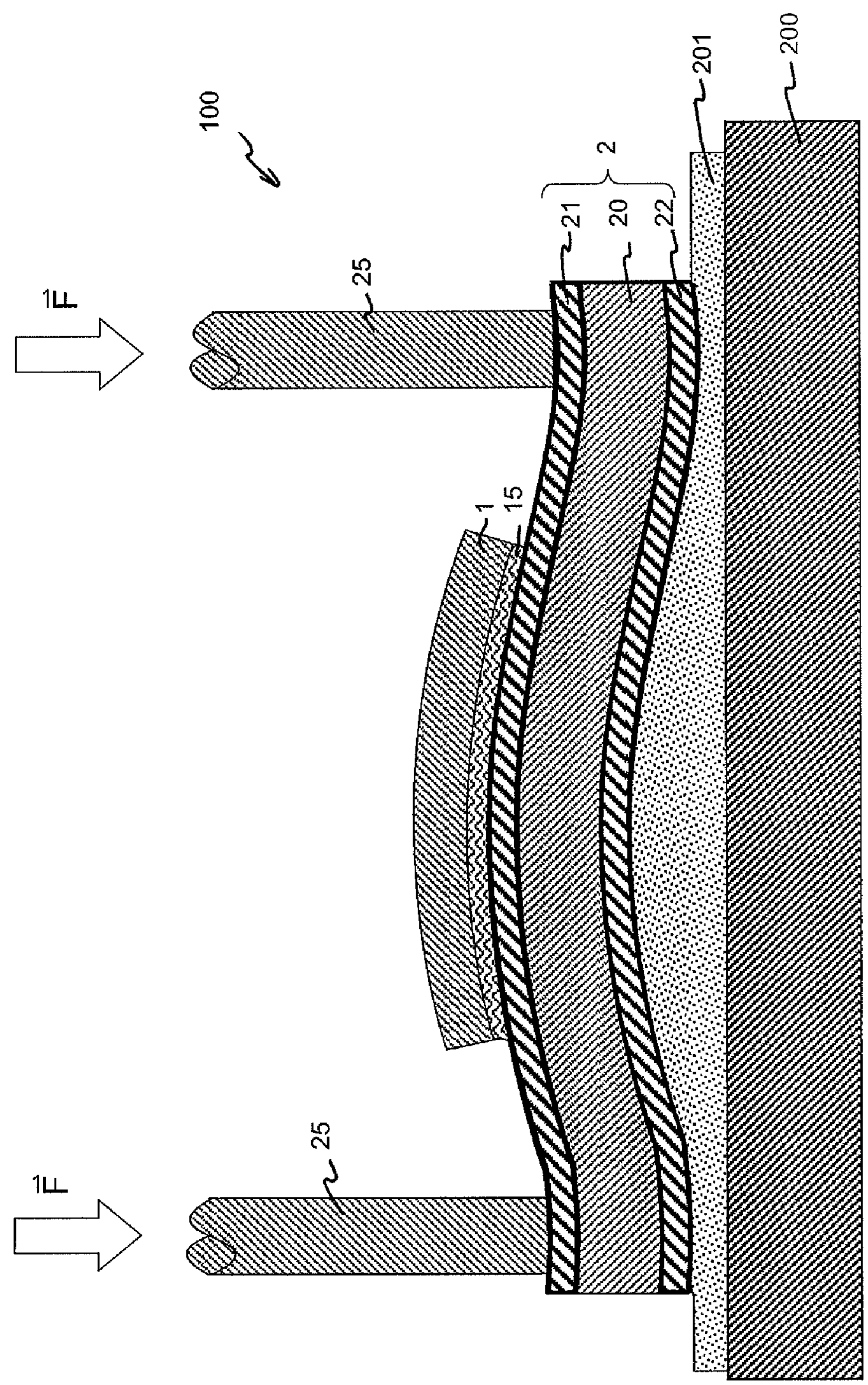
FIG. 1 is a cross-section through a portion of a conventional power semiconductor module assembly.
Figure 2:
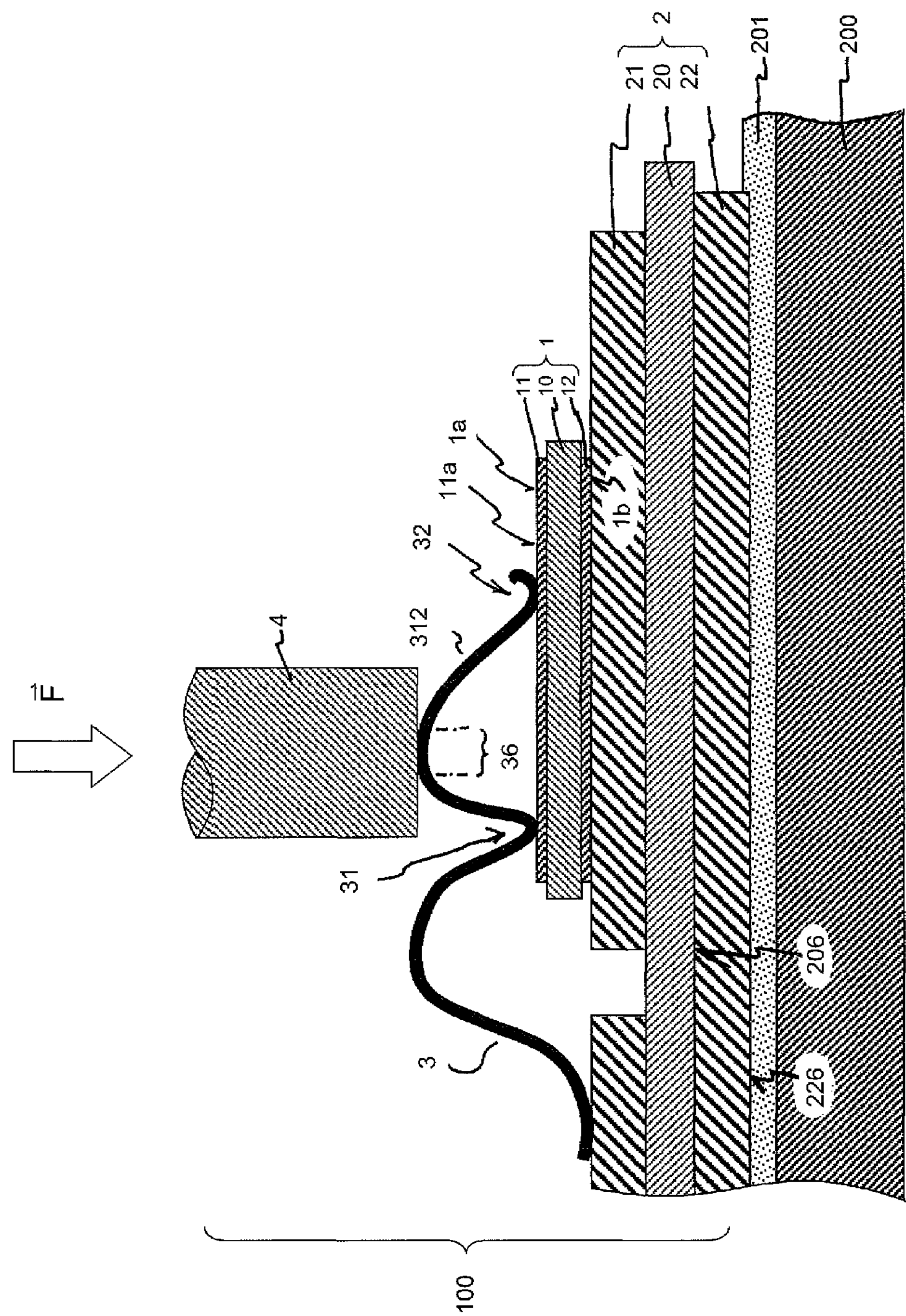
FIG. 2 is a cross-section through a portion of a power semiconductor module assembly in accordance with the present invention in which an urging element presses directly on a loop formed by a bond wire.

Referring now to FIG. 2 there is illustrated a vertical section through a portion of a power semiconductor module assembly. This assembly comprises a power semiconductor module 100 mounted on a heatsink 200 in being directly pressed against the heatsink 200. Disposed between the power semiconductor module 100 and the heatsink 200 is a thermal compound 201, for example a thermal paste or thermal foil.

The power semiconductor module 100 comprises a substrate 2 including a ceramic core 20 topped by a patterned top-side metallization 21 and bottomed by an optional bottom-side metallization 22 which, depending on the requirements, may also be patterned or not. The bottom of the power semiconductor module 100 is formed by the underside 22*b* of the bottom-side metallization 22 or, should this not be provided, by the underside 20*b* of the ceramic core 20.

The ceramic core 20 may be composed, for example, of aluminum oxide ($Al_2O_3$) or aluminum nitride (AlN) or of silicon nitride ($Si_3N_4$). The top-side metallization 21 and bottom-side metallization 22 respectively may consist, e.g., of copper or aluminum wholly or mainly. In particular, the substrate 2 may be configured as a direct copper bonding (DCB) substrate, as a direct aluminum bonding (DAB) substrate or as a direct aluminum brazing (AMB) substrate.

Arranged on a portion of the top-side metallization 21 is a power semiconductor chip 1 with a semiconductor body 10 comprising a top side 1*a* and a bottom-side 1*b* representing opposite sides of the power semiconductor chip 1. The power semiconductor chip 1 features a top terminal contact 11 and a bottom terminal contact 12. The terminal contacts 11, 12 which may be, for example, metallizations of the semiconductor body 10 form a pair of load terminals of the power semiconductor chip 1 which may be for example an IGBT, a MOSFET, a J-FET, a diode, thyristor or any other power semiconductor component. Correspondingly, the pairs of load terminals 11, 12 may be, for example, drain and source contacts or emitter and collector contacts or anode and cathode assigned optionally as to which is the top terminal contact 11 and which is the bottom terminal contact 12.

The power semiconductor chip 1 is bonded via the second load terminal 12 which may cover practically the total bottom-side 1*b* of the power semiconductor chip 1 by a large surface area and electrically conductive to a portion of the top-side metallization 21 of the substrate 2. Suitable joining techniques may be, for example, soldering or electrically conductive adhesive bonding as well as a low-temperature joining technique (LTJT) produced by a silverized paste being bonded between the power semiconductor chip 1 and the top-side metallization 21 and by the power semiconductor chip 1 being pressed against the substrate 2 for a specific time at an elevated temperature under high pressure. Not detailed nevertheless existing in FIG. 2 is a layer, i.e., of solder, adhesive or silver serving to join the load terminal 12 to the top-side metallization 21 ranging for example from 100 μm to less than 20 μm thick.

The top side 11*a* of the top load terminal 11 is formed by an electrical contact face 11*a* electrically circuited by means of a bond wire 3 bonded at least a first bond site 31 and at an adjoining second bond site 32 to the electrical contact face 11*a*. Furthermore, the bond wire 3 comprises a first bond wire portion 312 which in forming a loop extends full-length between the first bond site 31 and the second bond site 32 and is spaced away from electrical contact face 11*a*. Starting from the bond site 31 along the bond wire 3 to the second bond site 32 the bond wire 3 has neither a further bond site nor is it in contact with the first contact face 11*a*.

The sub-portion 36 of the first bond wire portion 312 is subjected by a contact pressure element 4 to a contact pressure force F produced by the power semiconductor module

100 being secured to the heatsink 200, for example, by being screwed thereto. This contact pressure force F is communicated via the first and second bond sites 31 and 32 respectively and the electrical contact face 11*a* to the power semiconductor chip 1, resulting in the power semiconductor chip 1 and the substrate 2 being pressed against the heatsink 200. The contact pressure element 4, which may take the form of a stamp, for example, exerts a pressure only to the sub-portion 36 of the bond wire portion 312 and not to the whole thereof. The spacing between the contact pressure element 4 and the first electrical contact face 11*a* in this arrangement is greater than the thickness the bond wire 3 has at the first bond site 31 and at the second bond site 32, each perpendicular to the first electrical contact face 11*a*. The material used for the contact pressure element 4 may be, for example, silicone.

The contact pressure force F is created by the power semiconductor module 100 being fixedly secured to the heatsink 200, otherwise, i.e., when the power semiconductor module 100 is removed from the heatsink 200 the latter is subjected to no contact pressure force F. Be that as it may, the contact pressure element 4 may be urged against the bond wire portion 312 in the direction of the power semiconductor chip 1 in the non-secured condition or at least contact the bond wire portion 312. As an alternative, the contact pressure element 4 may also be spaced away from the bond wire portion 312 in the non-secured condition.

To spread the contact pressure force F exerted by the bond wire 3 via the bond sites 31, 32 on the power semiconductor chip 1 the top load terminal 11 may be configured as a metallization comprising topmost a layer of silver or gold mounting a relatively thick metal platelet by means of a LTJT as explained above. The thickness of one such metal platelet may be selected to be 50 μm or more. Suitable metals for the metal platelet are molybdenum or copper coated with gold or silver and correspondingly featuring a gold or silver surface. In this embodiment, the bonds at the bond sites 31, 32 are produced on the metal platelet whose surface facing away from the power semiconductor chip 1 forms the electrical contact face 11*a*.

Figure 3:
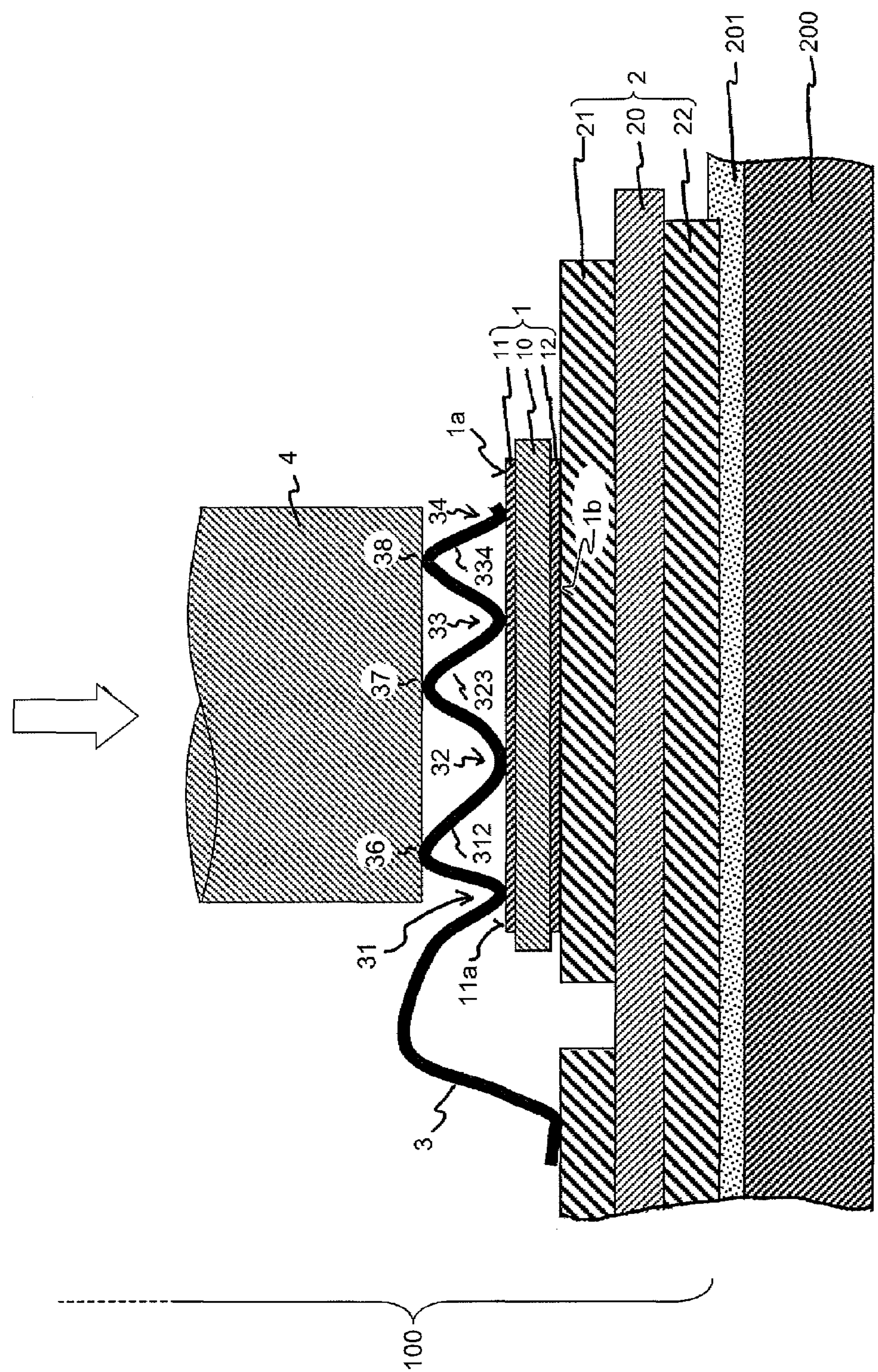
FIG. 3 is a cross-section through a portion of a power semiconductor module assembly in which an urging element presses directly on a plurality of loops formed by a bond wire.

Referring now to FIG. 3 there is illustrated how—unlike the example embodiment as shown in FIG. 2 in which the contact pressure element 4 exerts a contact pressure force F to just one loop of the bond wire 3 configured between bond sites 31, 32 of one and the same power semiconductor chip—a contact pressure element 4 may also exert a contact pressure force F on a plurality of bond wire portions 312, 323, 334 of the one and the same bond wire 3 correspondingly. As evident from FIG. 3 the bond wire 3 is bonded by the first, second, third and fourth bond sites 31, 32, 33 and 34 respectively to the contact face 11*a* of the power semiconductor chip 1. Between two each bond sites 31/32, 32/33 and 33/34 the bond wire 3 features bond wire portions 312, 323 and 334 respectively resulting from the bond wire 3 being spaced away from each location between the corresponding bond sites 31 and 32, 32 and 33 and 33 and 34 respectively from the contact face 11*a*. Each of the bond wire portions 312, 323 and 334 comprises a sub-portion 36, 37 and 38 respectively in which the contact pressure element 4 is urged against the corresponding bond wire portions 312, 323 and 334 respectively. It is to be noted that at each of these bond wire portions 312, 323 and 334, the contact pressure element 4 is urged only against the corresponding sub-portion 36, 37 and 38 respectively and not against the whole bond wire portion 312, 323 and 334 respectively. In other words, the bond wire 3 is disposed in each case between two adjacent bond sites 31 and 32, 32 and 33 or 33 and 34 respectively spaced away at least one site also from the contact pressure element 4, irrespective of whether the power semiconductor module 100 is fastened to the heatsink 200 or released therefrom. Providing two or more bond wire portions 312, 323, 334 on a power semiconductor chip 1 enables the contact pressure force F to be spread precisely over the electrical contact face 11*a*.

Figure 4:
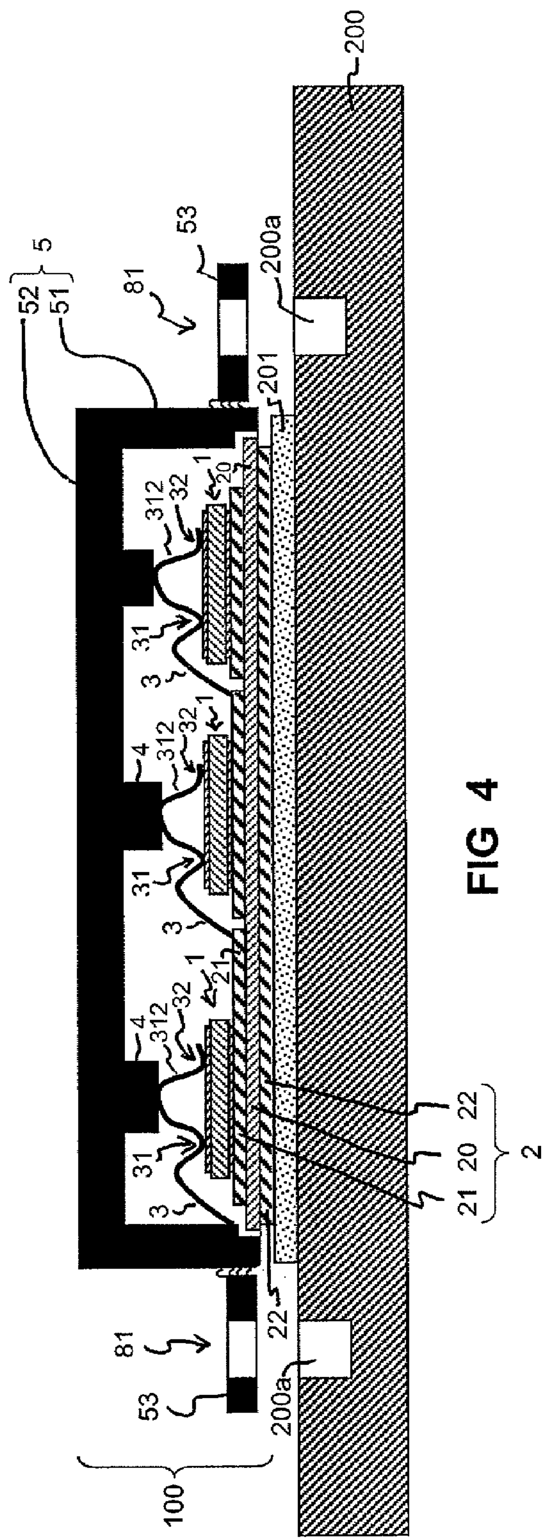
FIG. 4 is a cross-section through a power semiconductor module assembly including a power semiconductor module mounted on a heatsink and comprising a plurality of substrates, each of which is componented with a power semiconductor chip bonded at the top by means of a bond wire forming a loop via which an urging element exerts a contact pressure force on the corresponding power semiconductor chip.

Referring now to FIG. 4 there is illustrated a cross-section through a power semiconductor module assembly having, on a common substrate comprising a ceramic core 20 with a top-side metallization 21 and an optional bottom-side metallization 22, a plurality of power semiconductor chips 1 fastened as described above and electrically circuited by means of bond wires 3.

The power semiconductor module 100 comprises a housing 5 having a housing frame 51 and a housing cover 52. In the example embodiment as shown in FIG. 4 the housing frame 51 and housing cover 52 are configured integral. Such a housing 5 may be fabricated, for example, by means of injection molding in which the housing frame 51 and housing cover 52 are produced together in a single injection. In alternative embodiments, however, the housing frame 51 and housing cover 52 may also be produced each independently of the other and subsequently joined together.

In the embodiment as shown in FIG. 4 a contact pressure element 4 in the form of a stamp is arranged above each of the power semiconductor chips 1, each of which as detailed above in explaining FIG. 2, exerts via a bond wire portion 312 a contact pressure force F on the power semiconductor chip 1 and substrate 20, 21, 22 beneath in the direction of the heatsink 200 when the power semiconductor module 100 is fastened to the heatsink 200. In FIG. 4 the power semiconductor module 100 is simply located on the heatsink 200, i.e., not fastened thereto. Fastening may be done for example by means of mounting flanges 53 configured on the housing frame 51. These mounting flanges 53 may comprise, for example, fastener holes 81 by means of which the power semiconductor module 100 may be fastened in using corresponding tappings 200*a* configured in the heatsink 200. Thereby, at least one of fastener holes 81 may fully penetrate the substrate 2 in a direction perpendicular to the substrate 2. Optionally, the power semiconductor module may be equipped with just one fastener hole.

The contact pressure elements 4 are joined to the housing cover 52 by being, for example, formed integral with the housing cover 52. Such a housing cover 52 having one or more integrated contact pressure elements 4 may be fabricated, for example, by means of injection molding in producing the housing cover 52 or complete housing 5.

Figure 5:
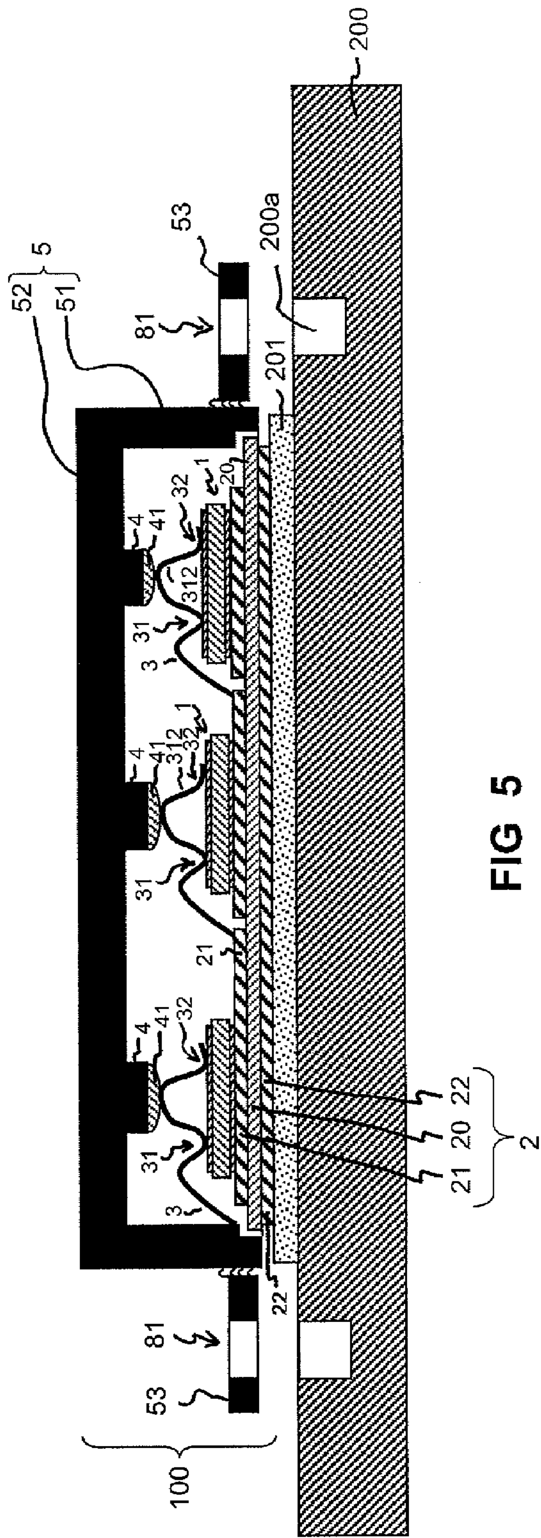
FIG. 5 is a cross-section through a power semiconductor module assembly differing from the power semiconductor module assembly as shown in FIG. 4 in that the urging elements comprise at their end facing the corresponding power semiconductor chip a force lead-in element.

Referring now to FIG. 5 there is illustrated an alternative embodiment in which a contact pressure element 4 comprises at its end facing the bond wire portion 312 a force lead-in element 41 to which the contact pressure element 4 contacts the bond wire 3. One such force lead-in element 41 may be configured more elastic than the elasticity of the remaining contact pressure element 4 to attain a homogenous lead-in of the force into the bond wire 3, by the force lead-in element 41, for example, being made of silicone rubber.

In another embodiment, a force lead-in element 41 may be formulated with a higher temperature resistance than that of the remaining parts of the contact pressure element 4. This has the advantage that the force lead-in element 41 is not thermally distorted, or only negligibly so, by heat occurring in operation of the power semiconductor module 100. For example, the material selected to make the force lead-in element 41 is impervious to thermal distortion at temperatures as high as, e.g., 240° C. or 180° C. One material suitable for such a force lead-in element 41 is, e.g., a ceramic.

Figure 6:
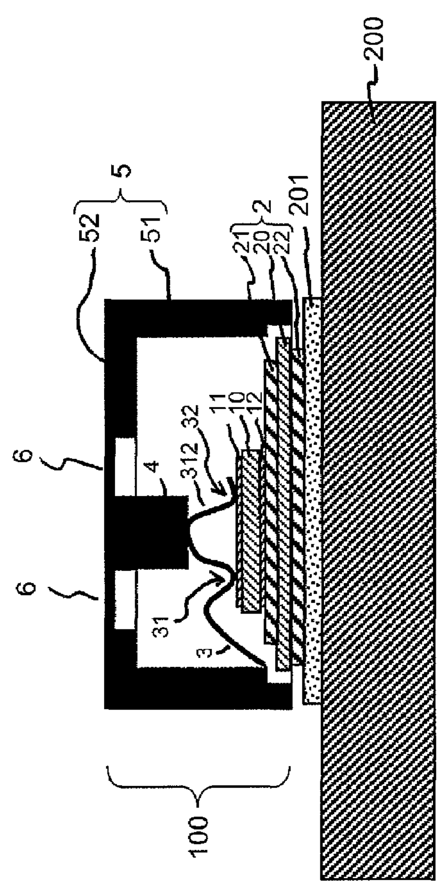
FIG. 6 is a cross-section through a power semiconductor module assembly in which an urging element is coupled to the cover of a module housing by a spring element formed by a waisting in the thickness of the housing cover.

Referring now to FIG. 6 there is illustrated how, for example, it may be an advantage to elastically fasten individual contact pressure elements 4 to the housing 5 by means of at least one spring element 6 to avoid overforcing the bond wire 3, ruining it and/or to compensate the differences in the height of the bond wire loops when a plurality thereof receive the contact pressure force. In this embodiment, the spring elements 6 are formed by the thickness of the housing cover 52 being reduced.

Figure 7:
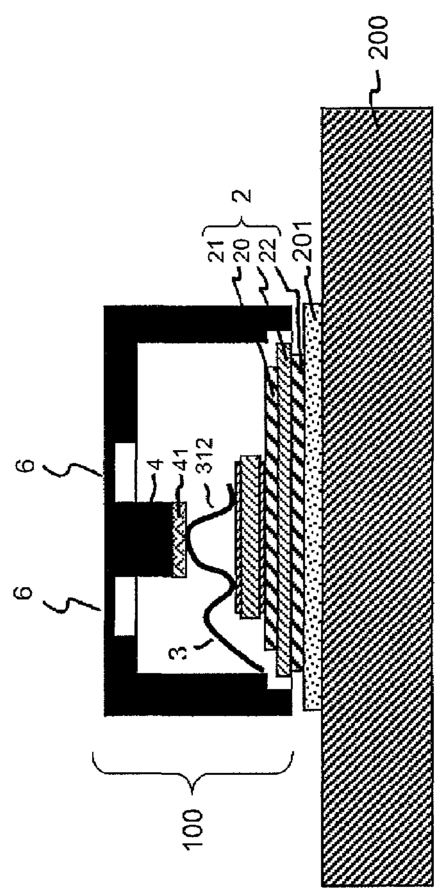
FIG. 7 is a cross-section through a power semiconductor module assembly which differs from the power semiconductor module assembly as shown in FIG. 6 in that the urging element comprises at its end facing the power semiconductor chip a force lead-in element.

Referring now to FIG. 7 there is illustrated how the example embodiment differs from that as shown in FIG. 6 in that the contact pressure element 4 comprises a high-temperature resistant force lead-in element 41 at its end facing the first bond wire portion 312.

Figure 8:
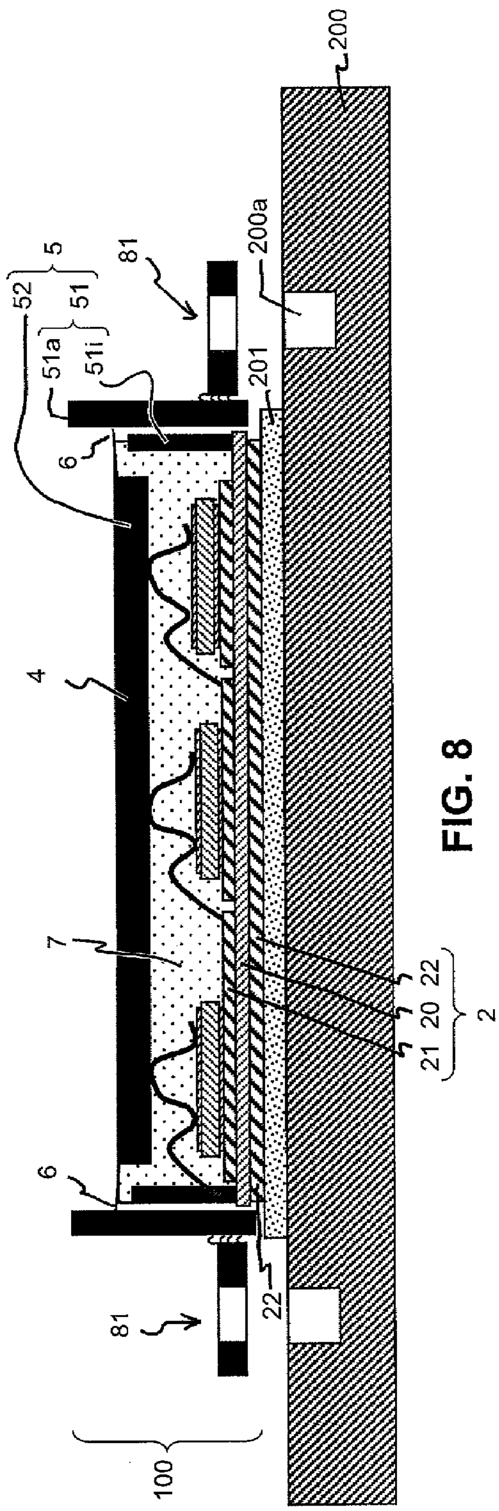
FIG. 8 is a cross-section through a power semiconductor module assembly in which the power semiconductor module includes a housing comprising a housing frame as well as a cover spring-coupled to the housing frame.

Referring now to FIG. 8 there is illustrated how the contact pressure element 4 is identical to the housing cover 52. The housing frame 51 comprises an inner housing frame 51*i* and an outer housing frame 51*a* to which the contact pressure element 4 is elastically coupled by means of spring elements 6 to produce a restoring force when the housing cover 52 is moved away from the outer housing frame 51*a* of the substrate 2. The spring elements 6 may be, for example, leaf springs or an elastic bead of adhesive may be employed. The inner housing frame 511 may be fastened to the substrate 2, for example, by being adhesively bonded thereto. In addition, the power semiconductor module 100 may be encapsulated by means of a soft encapsulant 7, for example, a silicone gel. The soft encapsulant 7 as shown in FIG. 8 is arranged within the inner housing frame 511 and not disposed between the inner housing frame 51*i* and outer housing frame 51*a*. Evident furthermore from FIG. 8 is how various bond wire portions 312 may be pressed by a common contact pressure element 4.

Figure 9:
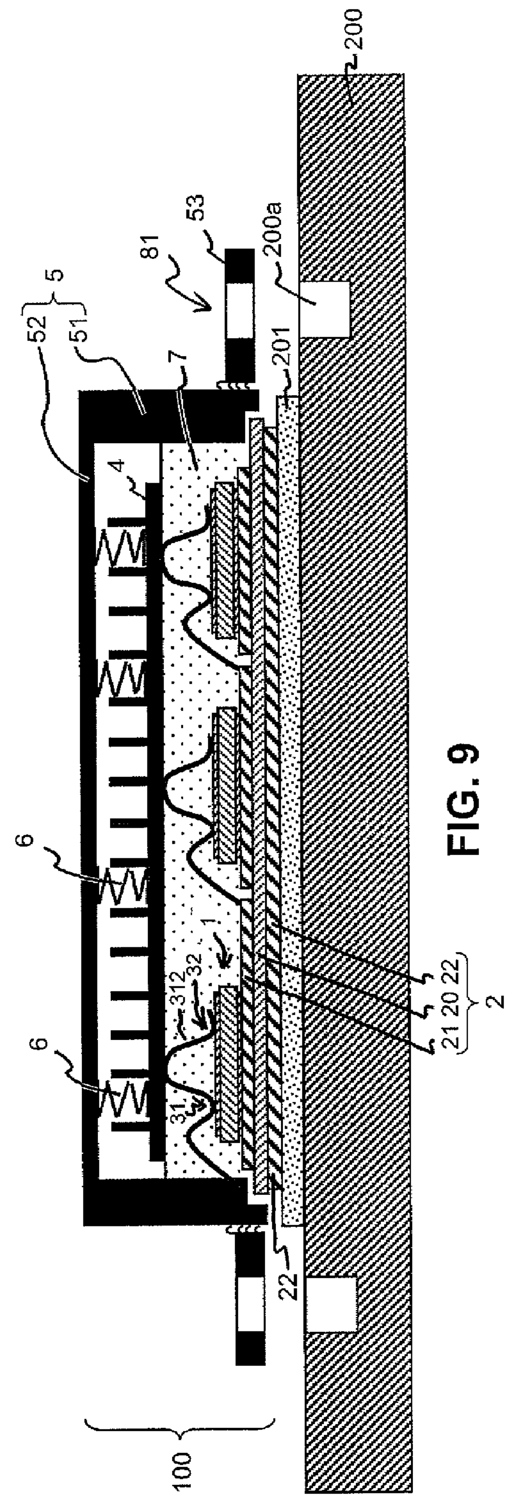
FIG. 9 is a cross-section through a power semiconductor module assembly in which the contact pressure element is configured as a pressure plate with pressure springs disposed between a housing cover and the pressure plate.

Referring now to FIG. 9 there is illustrated how in the power semiconductor module assembly the contact pressure element 4 is disposed between the housing cover 52 and one or more bond wires 3, it also comprising a pressure plate 42 oriented substantially parallel to the substrate 2. By means of spring elements 6, which as shown may be configured as springs or alternatively as pressure pads or disk springs, the contact pressure element 4 is elastically coupled to the housing cover 52. For this purpose, the spring elements 6 may be disposed between the housing cover 52 and the contact pressure element 4.

Screwing the power semiconductor module 100 to the heatsink 200 urges the housing 5 in the direction of the heatsink 200 so that the housing cover 52 creates via the spring element 6 and the contact pressure element 4 a force acting on the bond wire portions 312 to press the power semiconductor chip 1 and substrate 2 in the direction of the heatsink 200.

Figure 10:
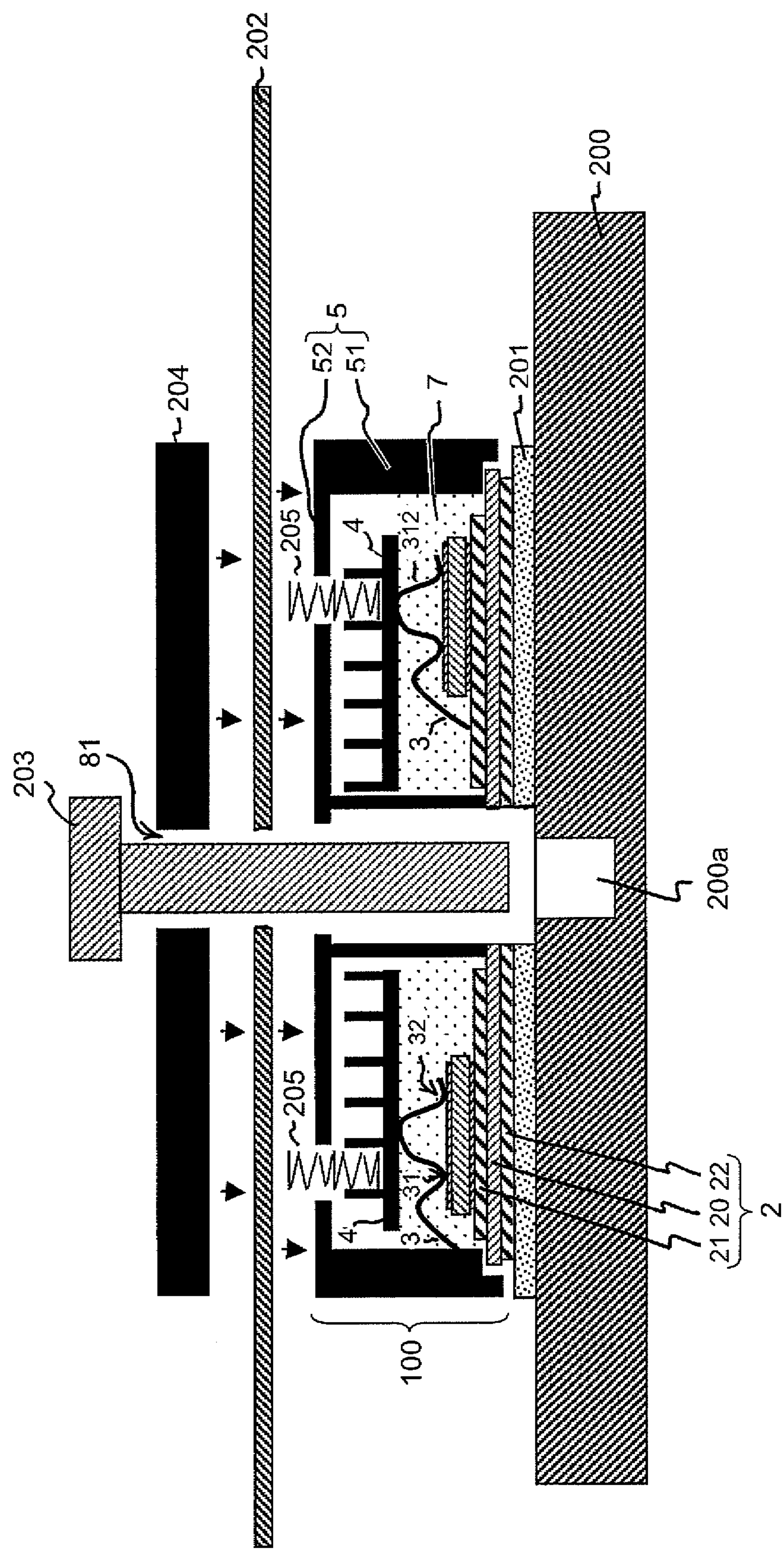
FIG. 10 is a cross-section through a power semiconductor module assembly in which the power semiconductor module comprises a sole central fastener hole through which the module can be screwed to a heatsink in simultaneously forming a contact pressure force acting on the power semiconductor chip.

Referring now to FIG. 10 there is illustrated an assembly including a power semiconductor module 100 comprising a fastener hole 81 via which the power semiconductor module 100 is fastened to the heatsink 200 by means of a sole screw 203. The axis of the fastener hole 81 is oriented substantially perpendicular to the substrate plane. To create a contact pressure force, at least one contact pressure element 4 is provided disposed between the housing cover 52 and the bond wire portion 312 to be pressed into place. An urging pressure plate 204 located at the side of the power semiconductor module 100 facing away from the heatsink 200 is likewise fastened to the heatsink 200 by means of the screw 203 for pressing the power semiconductor module 100 against the heatsink 200.

Disposed between the urging pressure plate 204 and the power semiconductor module 100 is, in addition, an optional printed circuit board 202, for example a control pcb including the electronics for gating the power semiconductor module 100 and which is screwed together with the urging pressure plate 204 and the power semiconductor module 100 to the heatsink 200. Disposed between the at least one contact pressure element 4 and the urging pressure plate 204 in each case are one or more coupling elements 205 arranged between the contact pressure element 4, on the one hand and the urging pressure plate 204, as well as the optional printed circuit board 202, on the other, and which are prestressed when screwing the power semiconductor module 100 to the heatsink 200 so that the contact pressure element 4 exerts a contact pressure force on the corresponding bond wire portions 312 as has already been detailed with reference to FIG. 2. Optionally, the urging element 204 and the contact pressure element 4 may be elastically coupled together by means of the coupling element 205.

In the example embodiments as described hitherto, the bond wire portions 312 receiving the force by means of a contact pressure element 4 were arranged above a top electrical contact face 11*a* of a power semiconductor chip 1. The adjacent bond sites 31, 32 of the bond wire 3 between which the corresponding bond wire portion 312 was disposed were each bonded to the same metallization.

Figure 11:
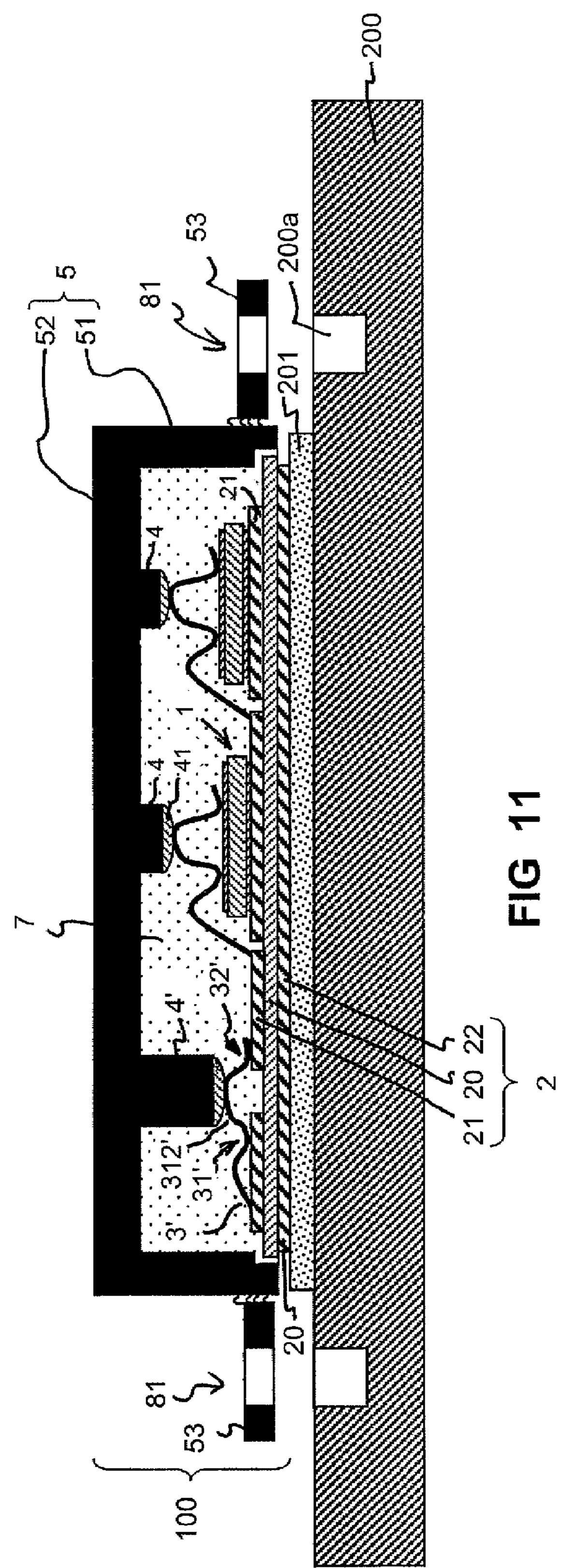
FIG. 11 is a cross-section through a power semiconductor module assembly in which the power semiconductor module comprises an urging element generating a contact pressure force on a loop of a bond wire configured alongside and not above a power semiconductor chip.

Referring now to FIG. 11 there is illustrated how as an alternative or in addition thereto it is also possible to exert a force pressing on a bond wire loop 312' configured between two adjacent bond sites 31' and 32' which are bonded to metallizations spaced away from each other. Now, a bond site 31' and a bond site 32' adjacent thereto along the bond wire 3' are bonded to different zones, spaced away from each other, of the top-side metallization 21 of the ceramic core 20. In another embodiment, the first bond site 31' could be bonded, for example, to a zone of the top-side metallization 21 of the ceramic core 20 and the second bond site 32' to a top electrical contact face of a power semiconductor chip 1. It is basically the case that a loop of a bond wire selectively pressed may be disposed between bond sites on optional objects such as, for instance, metallizations of a substrate, contact faces of a power semiconductor chip, conductor tracks on a printed circuit board and electrical contact tabs or busbars of the power semiconductor module.

As likewise evident from the example embodiment as shown in FIG. 11 different contact pressure elements 4, 4' may extend differingly far in the direction of the substrate 2 as may be wanted, for instance, when a difference in height has to be compensated for, because the tips of the various bond wire loops 312' and 312 to be pressed, differ in height relative to the substrate 2. As an alternative or in addition thereto, compensating the height in this way may also be achieved by means of a stepped contact pressure element 4 pressing down on the bond wire loops 312' and 312 and which comprises steps in height adapted to the height of these bond wire loops 312' and 312.

Figure 12:
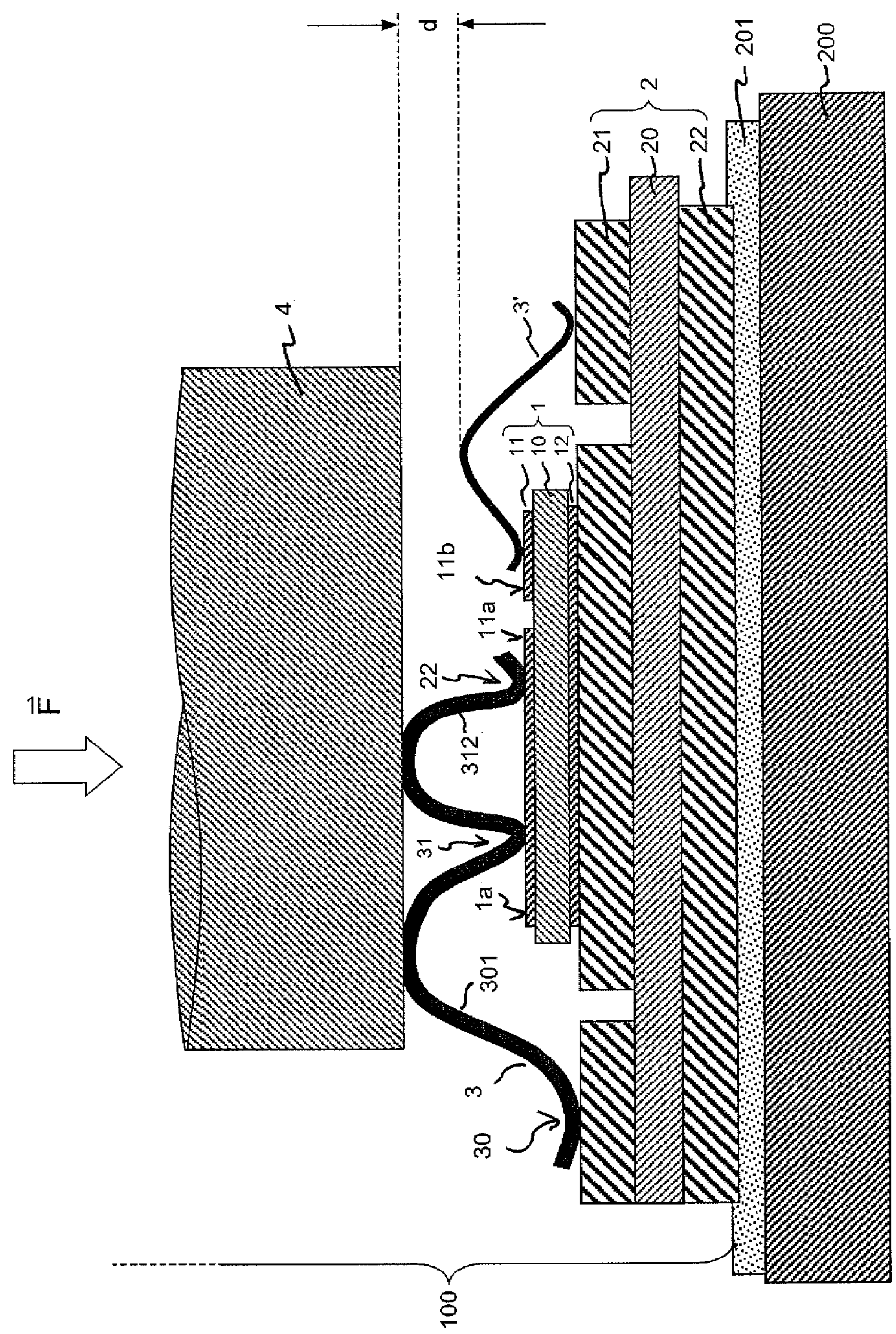
FIG. 12 is a cross-section through a portion of a power semiconductor module assembly in which the power semiconductor chip is topped by a large surface area metallization forming a load terminal as well as a small surface area metallization forming a gate contact, an urging element urging only the loops of such bond wires bonded to the load terminal.

Referring now to FIG. 12 there is illustrated how in the power semiconductor module assembly shown therein a contact pressure element 4 creates a force pressing on two bond wire loops 301 and 312, one of which is disposed between adjacent bond sites 31 and 32, both of which are bonded to the same electrical contact face 11*a* of the power semiconductor chip 1, whilst the other bond wire loop 301 extends between a bond site 30 on the top-side metallization 21 of the substrate 2 and the bond site 31 on the electrical contact face 11*a* of the power semiconductor chip 1.

In this case, the electrical contact face 11*a* is a load terminal of the power semiconductor chip 1, this being the reason why the bond wire 3 to boost its amperage has a large diameter and thus added stability. Since the power semiconductor chip 1 is a gatable power semiconductor chip it comprises a further electrical contact face 11*b* as a gating contact and which, like the electrical contact face 11*a*, is arranged at the top side 1*a* of the power semiconductor chip 1. The electrical contact face 11*b* may be, for example, a gate contact or base contact. This electrical contact face 11*b* is electrically bonded by means of a bond wire 3' to a zone of the top-side metallization 21 of the ceramic core 20. Since only small electrical currents are needed to gate gatable power semiconductor chips the bond wire 3' has a diameter which is small as compared to that of the bond wire 3, this being the reason why its mechanical stability is less than that of the thicker bond wire 3. To avoid damaging the thin bond wire 3' by the contact pressure element 4 it is provided for that the contact pressure element 4 and the bond wire 3'—when the power semiconductor module 100 is screwed ready for operation to the heatsink 200—comprise a minimum spacing d amounting to at least 1 mm, for example.

Figure 13:
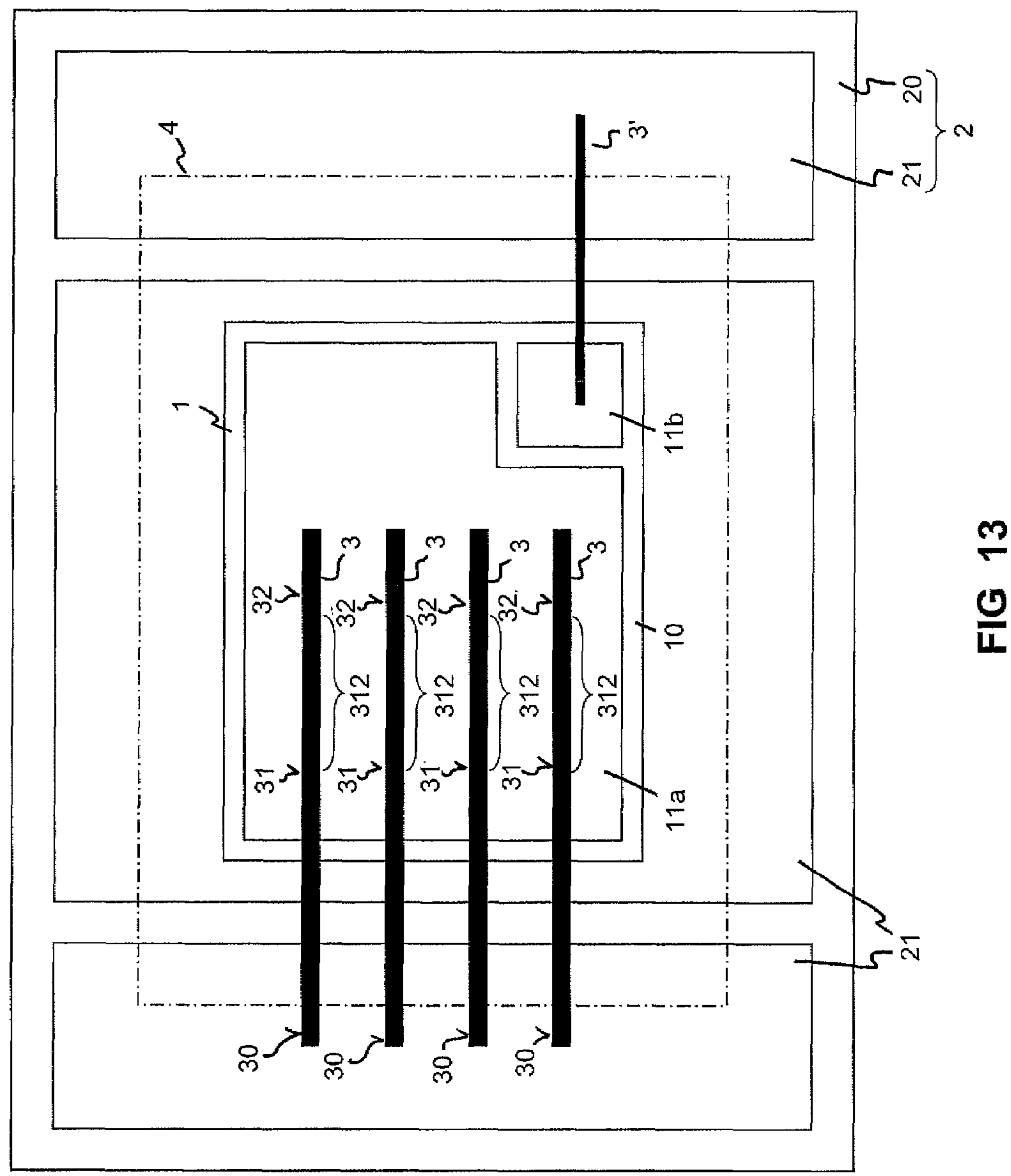
FIG. 13 is a top-down view of the substrate of the power semiconductor module as shown in FIG. 12.

Referring now to FIG. 13 there is illustrated a top-down view of the substrate 2 of the power semiconductor module 100 as shown in FIG. 12, making it evident how the first electrical contact face 11*a* is coupled to the top-side metallization 21 by means of four bond wires 3 electrically circuited in parallel. The broken lines mark the outer limits of the bottom end of the contact pressure element 4 facing the substrate 2 and the power semiconductor chip 1. Each of the bond wires 3 is connected by two bond sites 31, 32 to the first electrical contact face 11*a* to spread the contact pressure force over the chip surface area. It is basically possible to electrically circuit in parallel fewer or more than four bond wires 3, it also being possible that each bond wire 3 is connected by one, two, three or more bond sites 31, 32 to the first electrical contact face 11*a*. Depending on what is required, the number of bond wires 3 by which the first electrical contact face 11*a* is connected, the number of bond sites 31, 32 to which the each of these substrate 2 are connected to the first electrical contact face 11*a* and the number of bond wire portions 312 via which the contact pressure element 4 exerts a force pressing the power semiconductor chip 1 may all be optionally selected.

All bond wires 3 which as described above may be pressed to connect a power semiconductor chip 1 bottomed by a substrate 2 to a heatsink 200 may comprise—outside of the bond sites—a circular cross-section with a diameter ranging, for example, from more than 300 μm and/or, for example, less than 1 mm.

Instead of a circular cross-section, such a bond wire may also be configured as a ribbon with a cross-sectional area 1 to 10 mm wide and/or 0.1 to 2 mm thick, for example.

A bond wire 3 may be made, for example, of aluminum (Al) or aluminum magnesium (AlMg) or aluminum copper (AlCu) or copper (Cu) or comprise at least one of these materials. For example, a bond wire 3 may consist of aluminum or copper to 99.99%. In accordance with another example, a bond wire 3 may consist of an alloy of aluminum magnesium (AIMg) with an admixture of magnesium (Mg) ranging from 0.1 to 1 weight % as well as other admixtures as an option. A further example for a bond wire 3 suitable for press contacting is a bond wire 3 consisting mainly of copper, admixed with silver (Ag).

A bond wire 3' employed to contact an electrical contact face 11*b* representing a gate contact of the power semiconductor chip 1 may have a circular cross-section with a diameter, for example, smaller than or equal to 200 μm.

The geometry of the contact pressure elements 4, the number and spread of the bond sites 30, 31, 32, 33, 34 and of the bond wire portions 301, 312, 323, 334 as well as the bias of the spring element 6 and coupling element 205 for bonding the power semiconductor module 100 to the heatsink 200, along with the elasticity of the force lead-in element 41 may all be selected so that the power semiconductor chip 1 is pressed in the direction of the heatsink 200 by a contact pressure ranging from, for example, 5 to 100 N/cm2, for example 60 N/cm2.

The number of bond wires 3 used to electrically contact a first electrical contact face 11*a* of a power semiconductor chip 1 may be selected so that the temperature thereof in the range in which a bond wire 3 contacts a contact pressure element 4 does not exceed a temperature of 150° C. or 180° C. (corresponding to a temperature of the power semiconductor chip 1 of 175° C. and 200° C. respectively) at the current rating of the power semiconductor chip 1 and that a maximum temperature of 200° C. and 220° C. respectively is not exceeded in general.

In accordance with one embodiment of the invention, a contact pressure element 4 may be incrementally latched into place in a hole in the housing 5 so that for each latching increment the spacing of the contact pressure element 4 from the substrate 2 is correspondingly different. This makes it possible to individually adapt the spacing of the contact pressure element 4 to the height of a bond wire loop on which the contact pressure element 4 is to exert a contact pressure.

Optionally, a power semiconductor module 1 may include electrically defunct or irrelevant bond wires bonded to the top-side metallization 21 in forming one or more bond wire loops at optional sites on the module, for example at a first electrical contact face 11*a* and/or at the top-side metallization 21 to thus make it possible to create by means of a contact pressure element 4 a contact pressure acting on just a portion of a bond wire loop to press the power semiconductor chip 1 and/or substrate 2 in the direction of the heatsink 200.

Suitable materials for a contact pressure element 4 are, for example, plastics, metals or ceramics. Where a contact pressure element 4 used to apply pressure to several sub-portions of a bond wire portion to be electrically insulated from each other the contact pressure element 4 may be made either of an insulating plastic or metal electrically insulated at a suitable location by means of a plastic or ceramic relative to at least one bond wire portion. Furthermore, it is just as possible that the contact pressure element 4 comprises a core of plastic featuring at its side facing the substrate a thin metallization to achieve a better spread of the counter-force exerted by the bond wire 3 on the contact pressure element 4.

It is understood that all embodiments of features as explained above may be combined with any other features, particularly with features of other embodiments in any way possible as long as the one feature does not cancel out the other. This applies particularly also when the features concerned failed to be explained in combination with each other in an example embodiment herein.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

The invention claimed is:

1. A power semiconductor module configured to be mounted on a heatsink, said power semiconductor module comprising:

a power semiconductor chip arranged on a substrate, the power semiconductor chip comprising a bottom side facing the substrate, a top side facing away from the substrate, and an electrical contact face arranged on the top side;

a bond wire bonded by at least a first bond site and a second bond site to the electrical contact face and comprising between the first bond site and the second bond site a first bond wire portion made up by the whole portion of the bond wire between the first bond site and the second bond site, the bond wire being spaced away from the electrical contact face in this portion; and a contact pressure element shaped to exert a contact pressure force on the electrical contact face in mounting the power semiconductor module on the heatsink, the contact pressure force resulting in the power semiconductor chip and the substrate being pressed against the heatsink, the contact pressure force being created responsive to the contact pressure element being urged against just a sub-portion and not against the whole of the first bond wire portion.

2. The power semiconductor module as set forth in claim 1, wherein the spacing between the contact pressure element and the electrical contact face is greater than each of the thicknesses the bond wire has at the first bond site and the second bond site each perpendicular to the electrical contact face.

3. The power semiconductor module as set forth in claim 1, wherein the contact pressure element contacts the first bond wire portion at least when the contact pressure force is active.

4. The power semiconductor module as set forth claim 1, further comprising a housing with a housing frame and a housing cover bonded to, or forming, the contact pressure element.

5. The power semiconductor module as set forth in claim 4, wherein the contact pressure element is coupled to the housing frame and/or the housing cover by means of at least one spring element.

6. The power semiconductor module as set forth in claim 4, comprising a spring element materializing at a location where the thickness of the housing cover is reduced.

7. The power semiconductor module as set forth in claim 4, comprising a spring element configured as a pressure spring arranged between the contact pressure element and the housing cover.

8. The power semiconductor module as set forth in claim 4, comprising a spring element disposed between the housing cover and the housing frame and which creates a restoring force relative to the housing frame when the housing cover is moved away from the substrate.

9. The power semiconductor module as set forth in claim 4, wherein the housing frame comprises an outer housing frame and an inner housing frame arranged therein.

10. The power semiconductor module as set forth in claim 9, wherein the outer housing frame is movable relative to the inner housing frame in a direction perpendicular to the substrate.

11. The power semiconductor module as set forth in claim 9, wherein the inner housing frame is fixedly joined to the substrate.

12. The power semiconductor module as set forth in claim 1, wherein the contact pressure element is a stamp.

13. The power semiconductor module as set forth in claim 1, wherein the contact pressure element is a pressure plate.

14. The power semiconductor module as set forth in claim 1, wherein the bond wire is a ribbon.

15. The power semiconductor module as set forth in claim 1, wherein the contact pressure element comprises a high-temperature resistant force lead-in element at an end facing the bond wire portion, at which the force lead-in element contacts the bond wire.

16. The power semiconductor module as set forth in claim 1, wherein the contact pressure element is impervious to thermal distortion up to a temperature of 180° C. at least at an end facing the substrate.

17. The power semiconductor module as set forth in claim 16, wherein the contact pressure element comprises a high-temperature resistant force lead-in element at an end facing the substrate.

18. The power semiconductor module as set forth in claim 17, wherein the high-temperature resistant force lead-in element comprises silicone rubber or a ceramic.

19. The power semiconductor module as set forth in claim 17, wherein the high-temperature resistant force lead-in element is impervious to thermal distortion up to a temperature of 240° C.

20. The power semiconductor module as set forth in claim 1, wherein the bond wire comprises between the first bond site and the second bond site no further bond site.

21. A power semiconductor module assembly, comprising:

a heatsink; and a power semiconductor module connected to the heatsink, the power semiconductor module comprising:

a power semiconductor chip arranged on a substrate, the power semiconductor chip comprising a bottom side facing the substrate, a top side facing away from the substrate, and an electrical contact face arranged on the top side, the heatsink arranged at the side of the substrate facing away from the power semiconductor chip;

a bond wire bonded by at least a first bond site and a second bond site to the electrical contact face and comprising between the first bond site and the second bond site a first bond wire portion made up by the whole portion of the bond wire between the first bond site and the second bond site, the bond wire being spaced away from the electrical contact face in this portion; and a contact pressure element shaped to exert a contact pressure force on the electrical contact face in mounting the power semiconductor module on the heatsink, the contact pressure force resulting in the power semiconductor chip and the substrate being pressed against the heatsink, the contact pressure force being created responsive to the contact pressure element being urged against just a sub-portion and not against the whole of the first bond wire portion.

22. The power semiconductor module assembly as set forth in claim 21, further comprising an urging element arranged at the side of the power semiconductor module facing away from the heatsink, and a joining means fixedly joining the urging element, the power semiconductor module and the heatsink together, the urging element configured to exert a force on the contact pressure element to create the contact pressure force.

23. The power semiconductor module assembly as set forth in claim 22, further comprising a printed circuit board disposed between the urging element and the power semiconductor module.

24. A method of fabricating a power semiconductor module assembly, the method comprising:

providing a power semiconductor module configured to be mounted on a heatsink, said power semiconductor module comprising:

a power semiconductor chip arranged on a substrate, the power semiconductor chip comprising a bottom side facing the substrate, a top side facing away from the substrate, and an electrical contact face arranged on the top side;

a bond wire bonded by at least a first bond site and a second bond site to the electrical contact face and comprising between the first bond site and the second bond site a first bond wire portion made up by the whole portion of the bond wire between the first bond site and the second bond site, the bond wire being spaced away from the electrical contact face in this portion;

a contact pressure element shaped to exert a contact pressure force on the electrical contact face in mounting the power semiconductor module on the heatsink, the contact pressure force resulting in the power semiconductor chip and the substrate being pressed against the heatsink, the contact pressure force being created responsive to the contact pressure element being urged against just a sub-portion and not against the whole of the first bond wire portion;

providing a heatsink;

attaching the power semiconductor module to the heatsink, thereby producing a contact pressure force acting on the electrical contact face by which the contact pressure element is urged only on the sub-portion of the bond wire portion but not on the bond wire portion as a whole in pressing the power semiconductor chip and the substrate against the heatsink.

25. The method as set forth in claim 24, wherein the bond wire portion of the bond wire forms a loop which is pressed flat when bonding the power semiconductor module to the heatsink by the effect of the contact pressure force in the direction of the electrical contact face.

* * * * *